(12) United States Patent
Nakamata et al.

(10) Patent No.: US 8,605,377 B2
(45) Date of Patent: Dec. 10, 2013

(54) COLOR CONVERSION FILTER

(75) Inventors: Shinichi Nakamata, Matsumoto (JP); Naoyuki Kanai, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 278 days.

(21) Appl. No.: 12/735,542

(22) PCT Filed: Mar. 27, 2009

(86) PCT No.: PCT/JP2009/056311
§ 371 (c)(1),
(2), (4) Date: Oct. 25, 2010

(87) PCT Pub. No.: WO2009/119815
PCT Pub. Date: Oct. 1, 2009

(65) Prior Publication Data
US 2011/0038070 A1     Feb. 17, 2011

(30) Foreign Application Priority Data

Mar. 28, 2008   (JP) .................. 2008-087213

(51) Int. Cl.
*G02B 5/22* (2006.01)

(52) U.S. Cl.
USPC ............... 359/891; 359/892; 359/885

(58) Field of Classification Search
USPC ................................. 359/891, 892
See application file for complete search history.

(56) References Cited

U.S. PATENT DOCUMENTS

| | | | |
|---|---|---|---|
| 6,221,517 B1 | 4/2001 | Eida et al. | |
| 6,887,631 B2 * | 5/2005 | Kiguchi et al. | 430/7 |
| 2004/0201048 A1 | 10/2004 | Seki et al. | |
| 2007/0240596 A1 * | 10/2007 | Chen et al. | 101/483 |
| 2008/0129935 A1 * | 6/2008 | Cheng et al. | 349/106 |

FOREIGN PATENT DOCUMENTS

| | | |
|---|---|---|
| JP | 08-286033 A | 11/1996 |
| JP | 2000-353594 A | 12/2000 |
| JP | 2003-243154 A | 8/2003 |
| JP | 2004-361592 A | 12/2004 |
| JP | 2005-166315 A | 6/2005 |
| JP | 2005-203215 A | 7/2005 |
| JP | 2006-236963 A | 9/2006 |
| WO | WO 2006/022123 A1 | 3/2006 |
| WO | WO 2006/069784 A1 | 7/2006 |

* cited by examiner

*Primary Examiner* — Jade R Chwasz
(74) *Attorney, Agent, or Firm* — Rabin & Berdo, P.C.

(57) ABSTRACT

A low-cost, high-definition color conversion layer is made using the ink jet method, with the layer having a consistent thickness and not bleeding into adjacent subpixels. A color conversion filter (1000) is characterized by being formed with a bank layer (60) that has a plurality of gently-curved protrusions (63), each of which has a first portion (61) and a second portion (62).

5 Claims, 7 Drawing Sheets

COLOR CONVERSION FILTER

This application is the national phase of international application number PCT/JP2009/056311, filed on Mar. 27, 2009, and claims the benefit of priority of Japanese application 2008-087213, filed Mar. 28, 2008. The disclosures of the international application and the Japanese priority application are incorporated herein by reference.

BACKGROUND OF THE INVENTION

This invention relates to a color conversion filter, a color filter, and a method of manufacture thereof. In particular, this invention relates to a color conversion filter, color filter, and method of manufacture thereof, used in forming a display by lamination with a light-emitting member.

A color conversion method is a method for realizing multicolor light emission using organic EL elements. In the color conversion method, a color conversion layer, which absorbs light emitted by an organic EL element and emits light with a wavelength distribution different from the absorbed wavelengths, is placed in front of the organic EL element, to express multiple colors. In Patent Reference 1 (identified below) and elsewhere, a resin dispersed-type color conversion layer is disclosed, in which a fluorescent dye is dispersed in a polymer resin, as such a color conversion layer. In color conversion methods, single-color emitting organic EL elements can be used, so that manufacturing is facilitated. Hence energetic studies are underway on application of organic EL elements having color conversion layers to large-screen displays.

Further, such display types have the characteristic that satisfactory color reproducibility is obtained by combining a color conversion layer and a color filter. However, in order to obtain adequate efficiency from such a resin dispersed-type color conversion layer, the film thickness must be made as thick as approximately 10 μm. Further, special technologies are required, such as technology for flattening roughness in the color conversion layer in order to form the organic EL element on the upper face thereof, and technology to shut out moisture appearing from the color conversion layer, and these contribute to drive up the cost of display panels.

As a measure to resolve the above problems, methods for forming layers having color conversion functions using dry processes, such as evaporation deposition and sputtering methods, have been proposed. In such methods, color conversion layers with a film thickness of 2 μm or less can be formed, but there is the problem that highly precise patterning (for example, at 150 ppi or higher) is difficult.

As a method which further develops the above-described measure, a method is conceivable in which an ink comprising the constituent material is prepared, and an inkjet method is used to form a patterned color conversion layer. Advantages of the inkjet method are the high efficiency of use of ink, and the ability to hold down the cost of manufacture of the color conversion layer.

However, it is known that when performing precise patterning, there is a need to suppress shifts in the position of impact of dispensed ink drops, and to suppress protrusion into adjacent pixels after impact. As means for resolving such problems, methods have been proposed in which banks are formed on the substrate side (see Patent Reference 2 and Patent Reference 3, which are identified below). In order to more effectively fabricate high-precision patterns using banks, a method is also proposed in which surface treatment using plasma treatment or similar according to the bank material is performed, and banks having a layered structure of different materials are formed (see Patent Reference 3).

When a color conversion filter is used in an organic EL display having a top-emission structure, in general a configuration is employed in which an organic EL substrate having a plurality of light-emitting portions and a color conversion filter are laminated. At this time, if the gap between the substrate and the color conversion filter is too great, there is the problem that light emitted by the light-emitting portions intrudes into adjacent pixels or subpixels (crosstalk). On the other hand, if the gap is too narrow, there are concerns regarding the effects of interference and/or mechanical contact with the light-emitting region. In particular, in an organic EL display using the color conversion method, the light quantity incident on the color conversion layer greatly contributes to the conversion efficiency, and so control of the gap using spacers is important.

Patent Reference 1: Japanese Patent Laid-open No. H8-286033.
Patent Reference 2: Japanese Patent Laid-open No. 2005-203215.
Patent Reference 3: Japanese Patent Laid-open No. 2000-353594.
Patent Reference 4: Japanese Patent Laid-open No. 2003-243154.

As is disclosed in Patent Reference 4, it is known that in an organic EL display with a top-emission structure, by filling the gap with epoxy resin or another resin and increasing the refractive index in the gap, the efficiency of light extraction is improved. However, in general epoxy resins and other resins have high viscosity, and so are difficult to spread uniformly in the gap during lamination. Particularly in the case of a color conversion filter in which banks are formed, when using a simple dripping lamination method, the resin does not spread everywhere on the inside of the outer periphery seal material, so that even in a panel measuring approximately two to three inches, a portion of the screen is not filled with resin, and the problem of uneven brightness occurs.

Figure 2:
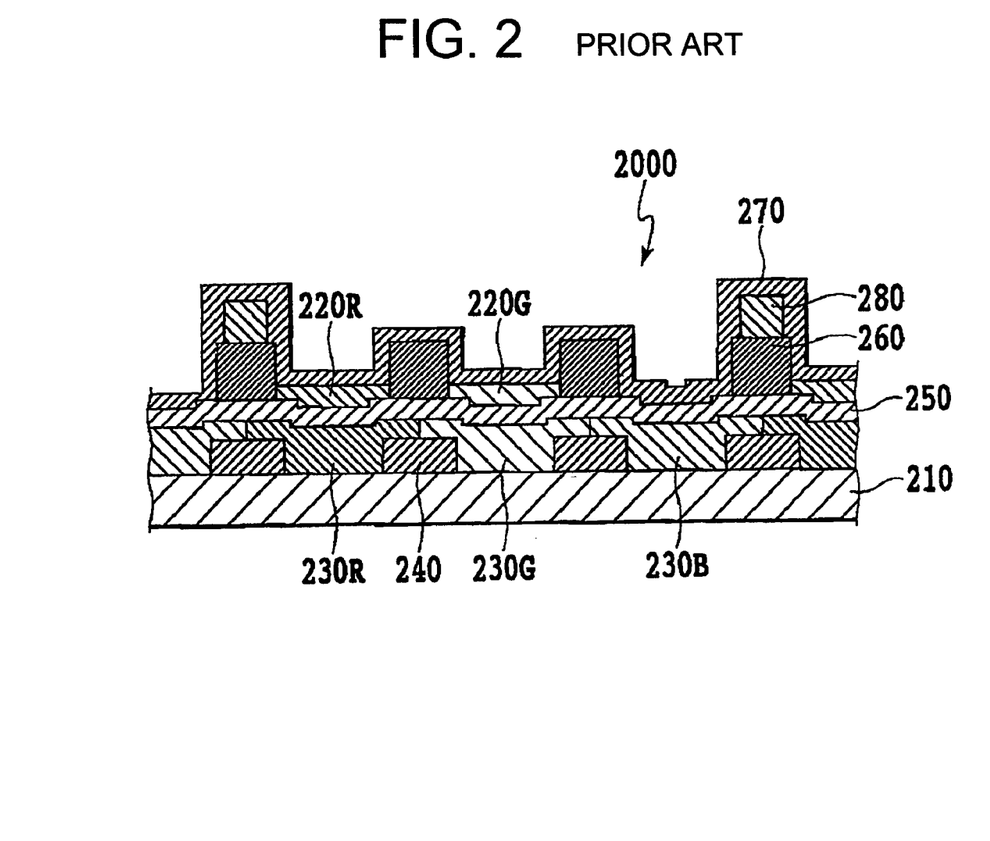
FIG. 2 is a summary cross-sectional view of a color conversion filter 2000 of the prior art (comparative example)

In the color conversion filter 2000 of the prior art shown in FIG. 2, a spacer portion 280 is fabricated on the bank layer 260, so that depending on the conditions of the photolithography method used, acute-angle portions may occur in the shape of the joined portion of the spacer 280 and the bank 260. Consequently, in the prior art color conversion filter 2000, the barrier layer 270 is not adequately covered on the spacer portions 280 and bank layer 260, so that gaps tend to occur near portions at which there are acute angles in the joining portion of the barrier layer 270. As a result, when the color conversion layer 220 is vulnerable to water and/or oxygen, moisture from these gaps may reach the color conversion layer 220 either via the interface with the barrier layer 270, the spacer portions 280 and bank layer 260, or through moisture absorption by the spacer portions 280 and bank layer 260 themselves, so that the lifetime of the color conversion layer 220 is significantly harmed.

Hence in order to manufacture a high-precision, high-efficiency organic EL element, (1) prevention of ink leakage into regions other than the subpixel (in particular, into adjacent subpixels) to form the desired color conversion layer in the prescribed subpixels, and (2) precise control of the gap with the substrate in lamination of the color conversion filter to the organic EL substrate, and uniform filling of the gap with resin, are sought.

Further, in the color conversion filter 2000 of the prior art shown in FIG. 2, the bank layer 260 exists discontinuously on the substrate relative to the display portion, in a ratio of from 10 to 20%. The spacer portions 280 are formed on the bank layer. As the fineness of the pixels increases, for a width of the bank layer 260 of 10 to 15 μm, the width of the spacer portions 280 also becomes approximately 10 μm, a magnitude extremely close to that of the bank layer 260. In such a case, the spacer portions 280 formed on the bank layer 260 tend to protrude due to shifts in the photomask position, and unevenness occurs in the heights of the spacer portions 280. Hence when forming spacer portions 280 of the prior art, the photomask must be aligned with high precision.

Further, when after formation of the bank layer 260 the material layer of the spacer portions 280 is applied onto the bank layer 260, in order to form the layer with the desired film thickness without unevenness, it is extremely difficult to control the viscosity and/or solid fraction of the resin applied and formed, and to control the rotation rate and similar.

SUMMARY OF THE INVENTION

This invention was devised in light of the above problems, and provides a color conversion filter in which there is no leakage of ink into adjacent subpixels, and which is suitable for uniform filling with resin for refractive index adjustment at the time of lamination of a substrate, as well as a method of manufacturing such a color conversion filter, at low cost and with high fineness.

This invention relates to a color conversion filter, having a transparent substrate; at least two types of color filter layers; a plurality of bank layers, formed on the boundaries between different types of color filter layers; a color conversion layer, positioned between adjacent bank layers; and, a barrier layer, which covers the color filter layers, bank layers, and color conversion layer; and is characterized in that at least a portion of the plurality of bank layers has a plurality of protuberances formed from gentle curved surfaces.

This invention comprises a color conversion filter in which the bank layers include a first layer comprising a plurality of portions, and a second layer covering the first layer, and in which the first layer exists in the positions of the plurality of protuberances.

This invention comprises a color conversion filter in which the second layer of the bank layers is formed using a photosetting resin or a photosetting/thermosetting resin.

This invention comprises a color conversion filter in which the first layer and second layer of the bank layers are formed from the same material.

Further, this invention also relates to a color filter, having a transparent substrate; at least two types of color filter layers; a plurality of bank layers, formed on the boundaries between different types of color filter layers; and a barrier layer, covering the color filter layers and bank layers, and is characterized in that at least a portion of the plurality of bank layers has a plurality of protuberances formed from gentle curved surfaces.

This invention comprises a color filter in which the bank layers include a first layer comprising a plurality of portions, and a second layer covering the first layer, and in which the first layer exists in the positions of the plurality of protuberances.

This invention comprises a color filter in which the second layer of the bank layers is formed using a photosetting resin or a photosetting/thermosetting resin.

This invention comprises a color filter in which the first layer and second layer of the bank layers are formed from the same material.

Further, this invention comprises a method of manufacture of the above color conversion filters.

By means of this invention, because a portion of the bank layers provided to form the color conversion layer with high fineness has a plurality of protuberances formed from gentle curved surfaces, a color conversion filter having the following advantages can be provided: (1) leakage of ink into regions other than the subpixel (in particular, into adjacent subpixels) can be prevented, and the desired color conversion layer in the prescribed subpixels can be formed; and, (2) precise control of the gap with the substrate in lamination of the color conversion filter to the organic EL substrate, and uniform filling of the gap with resin without impeding the flow of resin when filling the gap with resin, are possible.

Further, by forming the plurality of protuberances from gentle curved surfaces, there are no acute angles in the shapes of joining portions between the barrier layer and bank layers when forming the barrier layer covering the color filter layers, color conversion layer, and bank layers, so that the occurrence of gaps with the barrier layer near joining portions can be prevented. As a result, degradation of the organic EL element comprising a color conversion layer of this invention due to the outside environment can be prevented.

DESCRIPTION OF THE PREFERRED EMBODIMENT

Below, a preferred embodiment of the invention is explained in detail, referring to the drawings. The embodiment described below is merely an example of the invention, and various appropriate design modifications can be made by a person skilled in the art.

Figure 1A:
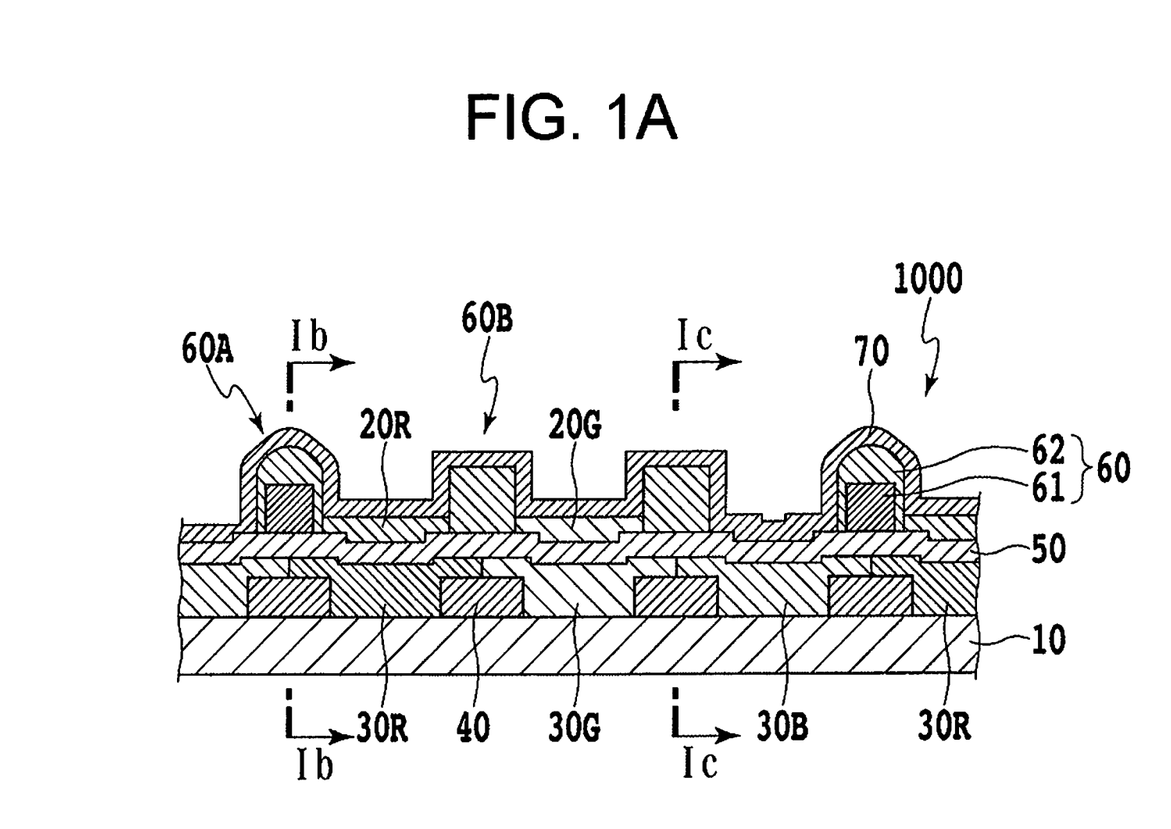
FIG. 1A is a summary cross-sectional view of a color conversion filter 1000 of this invention.
Figure 1B:
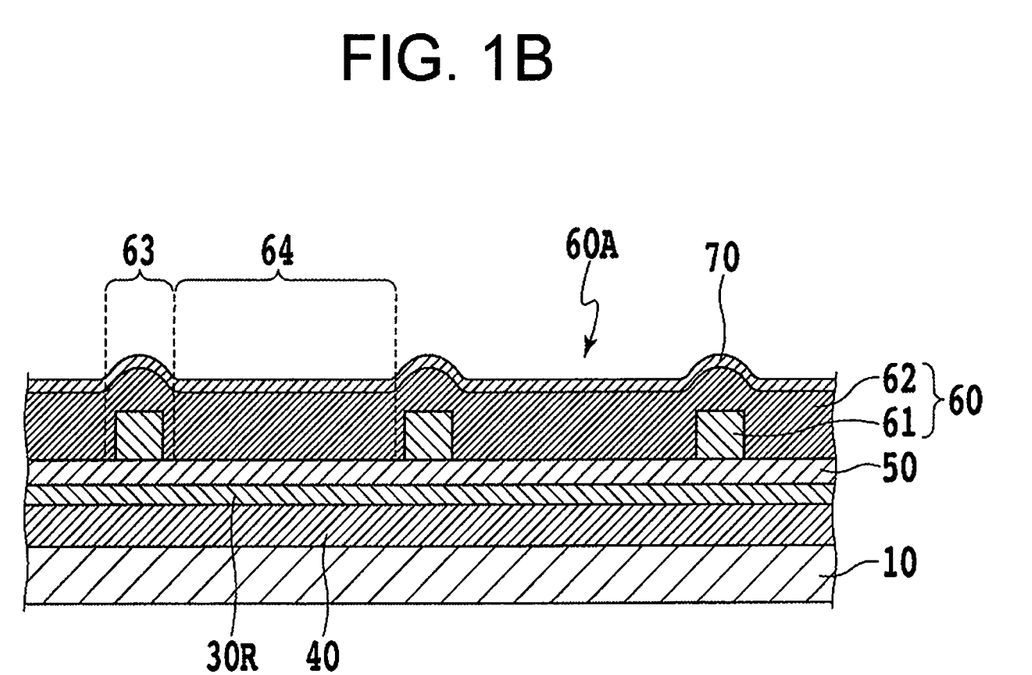
FIG. 1B is a cross-sectional view of the color conversion filter 1000 along the section line Ib-Ib in FIG. 1A.
Figure 1C:
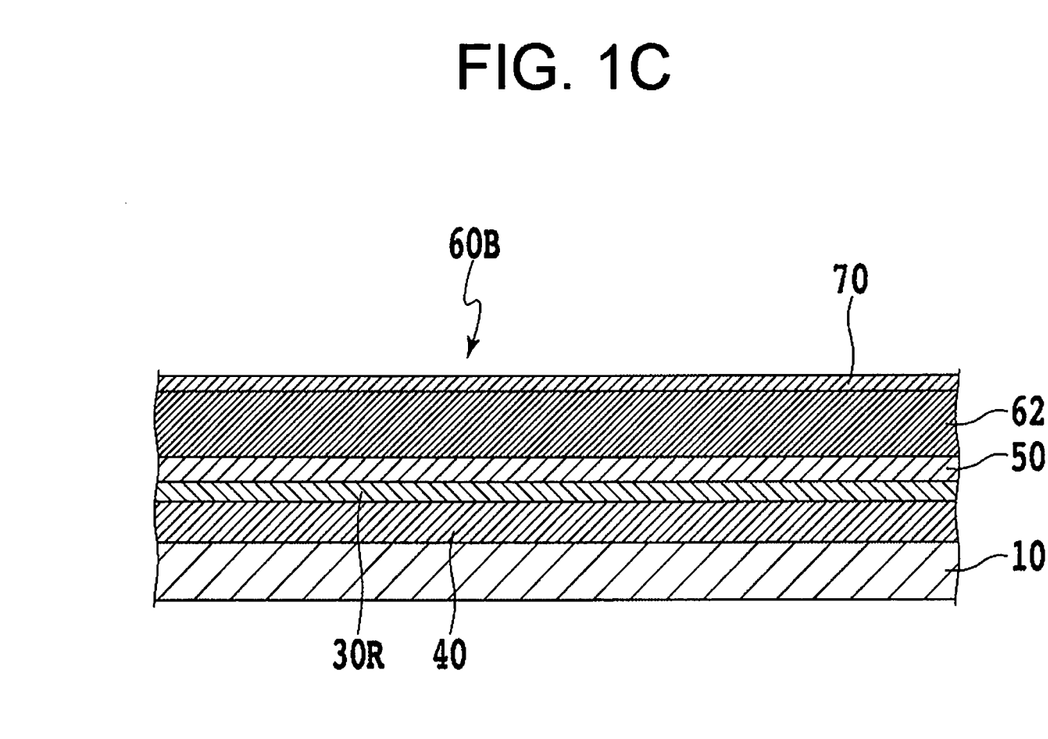
FIG. 1C is a cross-sectional view of the color conversion filter 1000 along the section line Ic-Ic in FIG. 1A.

FIG. 1A to FIG. 1C show examples of a color conversion filter 1000 of this invention.

The color conversion filter 1000 of FIG. 1A has, on a transparent substrate 10 serving as a support member, a black matrix 40; three types of color filter layers or elements 30 (R, G, B); a lyophilic layer 50; bank layers or elements 60, provided on the lyophilic layer 50 at the positions of boundaries between different color filter layers 30; two types of color conversion layers or elements 20, provided on the lyophilic layer 50 between adjacent bank layers 60; and a barrier layer 70, formed so as to cover the lyophilic layer 50, the bank layers 60, and the color conversion layers 20. Further, the bank layers 60 include bank layers or elements 60A, having protuberances 63 formed from gentle curved surfaces, and bank layers or elements 60B not having these protuberances 63. The bank layers 60A with protuberances 63 include first portions 61 and second portions 62 covering the first portions 61. The bank layers 60B without protuberances 63 include second portions 62, without the first portions 61.

While not limited to this configuration, in the color conversion filter 1000 of FIG. 1A, the color conversion layers 20 are only a red color conversion layer 20R provided on the lyophilic layer 50 of the red color filter layer 30R, and a green color conversion layer 20G provided on the lyophilic layer 50 on the green color filter layer 30G. That is, in this embodiment, a color conversion layer is not provided on the lyophilic layer 50 on the blue color filter layer 30B.

FIG. 1B shows a cross-sectional view of the color conversion filter 1000 along the section line Ib-Ib in FIG. 1A. The bank layer 60 shown in FIG. 1B is the bank layer 60A, having protuberances 63 formed from gentle curved surfaces. In the bank layer 60A, protuberances 63 and flat portions 64 without protuberances exist continuously in alternation along the long-axis direction of the bank layer 60A. The first portions 61, covered by the second portions 62, exist on the lyophilic layer 50 in positions of the protuberances 63. On the other hand, the flat portions 64 are formed only from the second layer 62.

FIG. 1C shows a cross-sectional view of the color conversion filter 1000 along the section line Ic-Ic in FIG. 1A. The bank layer 60 shown in FIG. 1C is the bank layer 60B, without protuberances 63. The bank layer 60B does not have the first portions 61, and is formed only from a layer that provides the second portions 62.

In this invention, the protuberances 63 can be used as spacers to precisely control the gap with the substrate in the process of lamination of the organic EL substrate and the color conversion filter. In particular, the protuberances 63 exist discretely on the color conversion filter, and so in the lamination process do not impede the spreading of the filling resin in the direction perpendicular to the bank layers 60, and moreover can secure a uniform lamination gap within the lamination plane.

Because the protuberances 63 are formed by the layer that provides the second portions 62 that covers the first portions 61, the protuberances protrude with gentle curved surfaces, and do not have stair-like step portions. Specifically, the protuberances 63 are formed such that, at any arbitrary point on the curved surface, the derivative of the curved surface is not discontinuous. By this means, there are no acute angles in the shapes of the joined portions of the barrier layer 70 and bank layers 60 when the barrier layer 70 is formed covering the color filter layers 30, color conversion layers 20, and bank layers 60, so that a uniform barrier layer can easily be formed. Further, the occurrence of gaps with the barrier layer 70 near the joined portions can be prevented, and degradation of the element due to the outside environment can be prevented.

Below, a preferred method of manufacture of a preferred color conversion filter 1000 of this invention is explained.

(Black Matrix Formation Process)

First, although an optionally selected process, a black matrix 40 is formed on the transparent substrate 10.

The black matrix 40 is a layer used to block visible light and improve contrast. The black matrix 40 can be formed using a material for use in ordinary flat panel displays. The film thickness of the black matrix 40 can be set arbitrarily, so long as the above-described functions are satisfied.

The black matrix 40 may be fabricated by forming an unhardened material layer over the entire surface of the transparent electrode using the spin coating method or another application method in wide use, and then patterned using a photolithography process, or, may be formed in a pattern shape using a screen printing method or similar technique. The black matrix 40 may comprise a plurality of stripe-shape portions (slit pattern) extending in a first direction. Or, the black matrix 40 may comprise stripe-shape portions extending in a first direction and a second direction (a direction perpendicular to the first direction), as an integrated layer having a mesh-like shape (slot pattern) with a plurality of opening portions. The opening portions of the black matrix 40 are positions for formation of subpixels.

Further, the transparent substrate 10 used in this invention has abundant transparency, and moreover can withstand the conditions (solvents, temperatures, and similar) used in formation of the black matrix 40, color filter layers 30 (R, G, B), and the color conversion layers 20, described below, as well as the organic EL element (electrodes, organic light-emitting layer, and similar elements). It is further preferable that dimensional stability be excellent. The material of the transparent substrate 10 may be any material which does not cause reduced performance of a multicolor light-emitting display. Examples of the material of the transparent substrate 10 include glass, various plastics, and various films and similar.

(Color Filter Layer Formation Process)

The color filter layers 30 are layers used to transmit visible light in specific wavelength regions, making the transmitted light a desired hue, and to improve the purity of the transmitted light. The color filter layers 30 can be formed using materials used in liquid crystal displays or other flat panel displays. In recent years, pigment-dispersed materials in which a pigment is dispersed in photoresist have been used in color filter layers 30. As shown in FIG. 1A to FIG. 1C, when three types of color filter layers are used, it is desirable that a blue color filter layer 30B which transmits wavelengths from 400 nm to 550 nm, a green color filter layer 30G which transmits wavelengths from 500 nm to 600 nm, and a red color filter layer 30R which transmits wavelength of 600 nm and above, each be used.

Each of the above-described color filter layers 30 may be formed by using spin coating or another application method in formation over the entire surface of the transparent substrate 10, after which photolithography or another method is used to perform patterning. Or, a screen printing method or similar may be used to form a pattern.

(Lyophilic Layer Formation Process)

Next, although an optionally selected process, a lyophilic layer 50 is formed on the color filter layers 30. The lyophilic layer 50 is a layer formed in order to improve the wetting characteristics of the ink on the surfaces of the color filter layers 30, when applying the ink for color conversion layer formation, described below, onto the color filter layers 30.

The lyophilic layer 50 is determined depending on the ink polarity. Materials which can be used in the lyophilic layer 50 include SiOx, SiNx and other inorganic oxides, and inorganic nitrides. The lyophilic layer 50 can be formed by a sputtering method, a CVD method, or another method.

Further, when a lyophilic layer 50 is not provided, plasma treatment or similar can be used to control the wettability of the surface on which the ink for color conversion layer formation is applied.

(Ink Layer Formation Process)

Next, bank layers 60 are formed on the lyophilic layer 50, at the boundaries between different types of color filter layers 30. Bank layers 60 comprise a bank layer 60A, having protuberances 63 formed from gentle curved surfaces, and a bank layer 60B not having protuberances 63.

In the bank layer 60A, protuberances 63 and flat portions 64 without protuberances exist continuously in alternation. The first portions 61 exist, covered by the second portions 62, on the lyophilic layer 50 at the positions of the protuberances 63. On the other hand, only the second portions 62 are formed in the flat portions 64. The bank layer 60B has no first portions 61, and is formed from only the layer that provides second portions 62.

The first portions 61 can be formed using a photosetting or a photosetting/thermosetting resin. For example, the first portions 61 can be formed by applying a photosetting or a photosetting/thermosetting resin, then performing light and/or heat treatment, causing generation of radicals and ions and inducing polymerization or bridging, rendering the resin insoluble. Further, when the first portions 61 are formed by a photoprocess, it is desirable that prior to hardening the photosetting resin or photosetting/thermosetting resin be soluble or dispersible in an organic solvent or an alkali solvent.

Photosetting or photosetting/thermosetting resins which can be used in this invention include:

(1) compositions comprising acrylic multifunction monomers or oligomers having a plurality of acroyl groups and methacroyl groups, and a thermopolymerization initiator;

(2) compositions comprising a polyvinyl phenylacrylate ester and a sensitizer;

(3) compositions comprising a chain or ring olefin and a bis azide; and, (4) compositions comprising a monomer having an epoxy group and a photoacid generator.

In particular, in cases in which the photosetting or photosetting/thermosetting resins of (1) above are used, a photoprocess can be used in highly precise patterning. Further, the materials of (1) are resistant to solvents and heat, and in other respects as well are reliable, and so are preferable.

Or, a thermoplastic resin or thermosetting resin may be used as the material of the first portions 61. Thermoplastic resins which can be used include polycarbonate (PC); polyethylene terephthalate (PET); polyether sulfone; polyvinyl butyral; polyphenylene ether; polyamide; polyether imide; norbornene system resins; methacrylic resins; isobutylene maleic anhydride copolymer resins; ring olefin system resins; and similar. Thermosetting resins which can be used include epoxy resins; phenol resins; urethane resins; acrylic resins; vinyl ester resins; imide system resins; urethane system resins; urea resins; melamine resins; and similar. Or, polymer hybrids, comprising polystyrene, polyacrylonitrile, polycarbonate, or similar with trifunctional or tetrafunctional alkoxysilane, may be used as the material of the first portions 61.

Figure 3A:
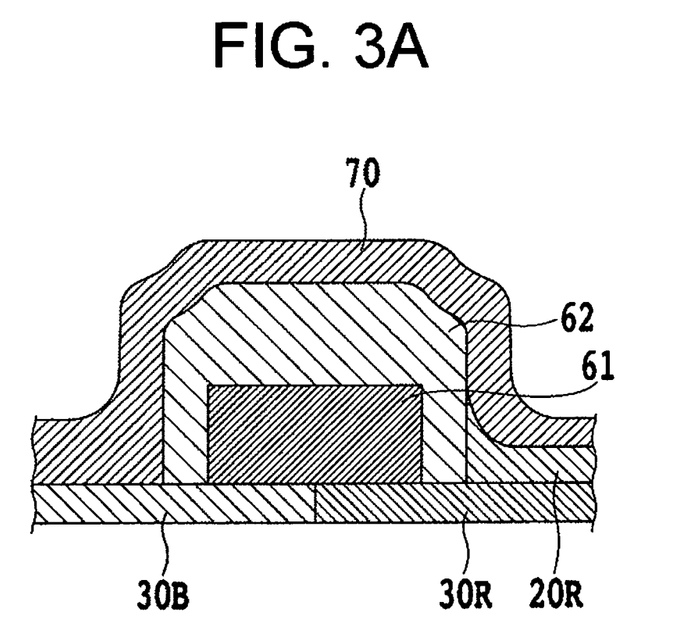
FIG. 3A is a summary cross-sectional view of a protuberance 63.
Figure 3B:
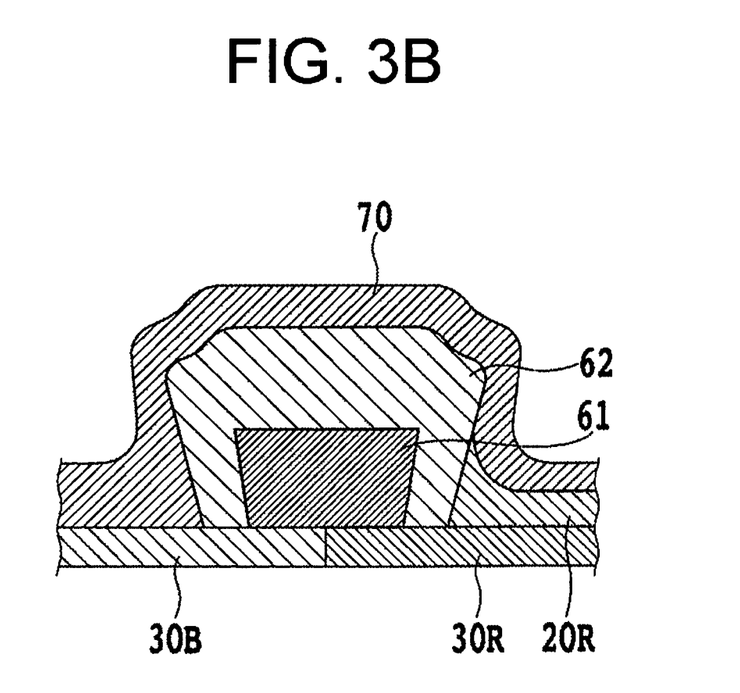
FIG. 3B is a summary cross-sectional view of a protuberance 63.
Figure 3C:
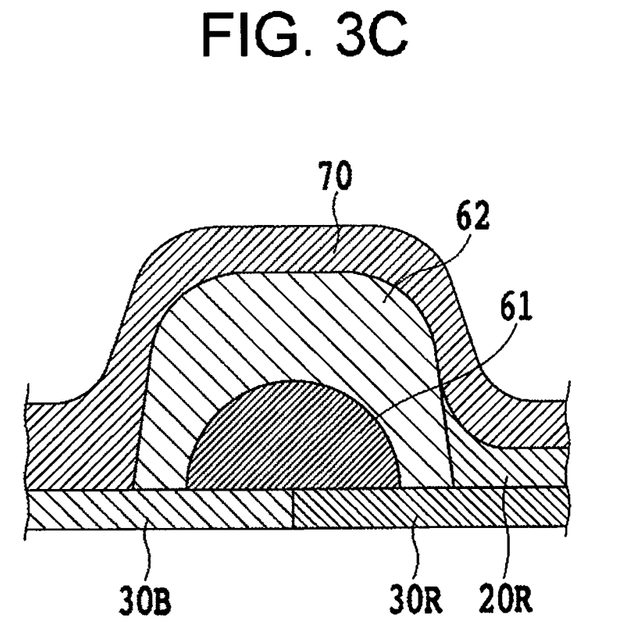
FIG. 3C is a summary cross-sectional view of a protuberance 63.

The first portions 61 can have a circular shape, rectangular shape, or other shape, and a width of approximately 10 μm. Specific examples of the first portions 61 include those with cross-sections, when sectioned perpendicular to the substrate, which are rectangular, inverse-tapered, and round (including semicircular, semi-elliptical, and similar shapes), as shown in FIG. 3A to FIG. 3C. It is desirable that the height of the first portions 61 be approximately 1 to 3 μm, in order that the height from the upper face of the lyophilic layer 50 to the peak portions of the protuberances 63 is 10 μm or less. If the height of the protuberances 63 is too low compared with the flat portions 64, spreading of the filling resin in the direction perpendicular to the banks is impeded. On the other hand, if the height of the protuberances 63 is too high, crosstalk occurs, in which light intrudes into adjacent pixels or subpixels.

Further, in the organic EL substrate lamination process, in order to secure a uniform lamination gap within the lamination plane without impeding the spreading of filling resin in the direction perpendicular to the bank layers 60, it is desirable that the protuberances 63 exist discretely, and preferably at equal intervals, on or on the periphery of the color filter layers 30 and/or on the periphery of the color conversion layers 20. In order to form the above protuberances 63, it is desirable that the first portions 61 also be formed discretely, and preferably at equal intervals, on or on the periphery of the color filter layers 30 and/or on the periphery of the color conversion layers 20. Specifically, it is desirable that the first portions 61 and/or protuberances 63 be formed at intervals of approximately one per pixel (per three subpixels). For example, they may be formed at the positions of intersection of stripe-shape portions of a black matrix 40 having a slot pattern.

Next, the second portions 62 are formed on the lyophilic layer 50 and the first portions 61. The second portions 62 are formed so as to be positioned above the boundaries of different types of color filter layers 30. Simultaneously, a layer that provides the second portions 62 covers the first portions 61, so that bank layers 60A are formed having protuberances 63. On the other hand, the layer that provides the second portions 62 may be formed directly on the lyophilic layer 50. In this case, a bank layer 60B is formed not having the flat portions 64, or the protuberances 63, of the bank layers 60A.

As the material of the second portions 62, the above photosetting or photosetting/thermosetting resins can be used. Or, a thermoplastic resin or a thermosetting resin may be used as the material of the second portions 62. The material of the second portions 62 may have the same properties as the material for the first portions 61 so long as, at the time of application, the combination is such that no film scattering or film separation occurs due to the first portions 61, or the material may be different. It is preferable that the second portions 62 be formed from the same material as the first portions 61.

The second portions 62 may be formed by forming a layer of the unhardened material on the surfaces of the lyophilic layer 50 and the first portions 61 using spin coating or another widely used application method, and then patterning using a photoprocess. Or, the second portions 62 may be formed in a pattern shape using a screen printing method or similar. And, the pattern shape of the second portions 62 may comprise a plurality of stripe-shape portions (a slit pattern) extending in a first direction. Or, the second portions 62 may be formed in a mesh pattern (slit pattern) comprising stripe-shape portions extending in a first direction and in a second direction (a direction perpendicular to the first direction), having a plurality of opening portions. A slit pattern is desirable in order not to impede the spreading of the filling resin, and in order to prevent color mixing into adjacent pixels. When the second portions 62 are fabricated in a slit pattern, in the bank layers 60A having protuberances 63, it is preferable that protuberances 63 and flat portions 64 without protuberances exist continuously in alternation in the direction of the long axis of the bank layers 60A.

In this invention, as opposed to cases in which spacer portions are formed on the upper portions of bank layers, the protuberances 63 are formed by covering the first portions 61 with a layer that provides the second portions 62, so that the protuberances 63 protrude with gentle curved surfaces, and can be formed without having stair-like step portions. Further, the viscosity and/or solid fraction of the resin used to form the second portions 62 on the first portions 61, as well as the rotation rate and similar parameters, can be controlled more easily than in the prior art. Further, the plurality of protuberances 63 can be formed without the occurrence of unevenness in heights.

(Color Conversion Layer Formation Process)

An inkjet method is used to cause adhesion of an ink comprising a color conversion dye onto the lyophilic layer 50 at positions between adjacent bank layers 60, to form at least one type of color conversion layer 20. A color conversion layer is a layer which functions to absorb light from a light source and cause fluorescence with a different wavelength distribution. In FIG. 1A, an example is shown in which two types of color conversion layers 20, which are a red color conversion layer 20R and a green color conversion layer 20G, are formed. Only a red color conversion layer 20R may be provided, as necessary. Or, in addition to the red color conversion layer 20R and the green color conversion layer 20G, a blue color conversion layer (not shown) may be provided.

The ink used to form the color conversion layers 20 comprises at least one type of color conversion dye, and a solvent. Color conversion dyes which can be used in this invention include Alq$_3$ (tris-8-quinolinato aluminum complex) and other aluminum chelate system dyes; 3-(2-benzothiazolyl)-7-diethylamino coumarin (coumarin 6), 3-(2-benzimidazolyl)-7-diethyl amino coumarin (coumarin 7), coumarin 135, and other coumarin system dyes; solvent yellow 43, solvent yellow 44, and other naphthalimide system dyes; and similar low-molecular-weight organic fluorescent dyes. Or, high-molecular-weight fluorescent dyes, of which polyphenylene, polyarylen, and polyfluorene are representative, may be used as color conversion dyes.

A mixture of two or more types of dyes may be used as a color conversion dye, as necessary. Use of a dye mixture is an effective means when converting blue light into red light, or in other cases when the wavelength shift amount is large. The dye mixture may be a mixture of the above-described dyes. Or, the mixture may be a mixture of the above-described dyes with the following dyes.

(1) A quinacridone derivative such as diethyl quinacridone (DEQ);

(2) 4-dicyanomethylene-2-methyl-6-(p-dimethyl amino styryl)-4H-pyran (DCM-1, (I)), DCM-2 (II), DCJTB (III), and other cyanine dyes;

(3) 4,4-difluoro-1,3,5,7-tetraphenyl-4-bora-3a,4a-diazo-s-indacene (IV);

(4) Lumogen F red;

(5) Nile red (V);

(6) rhodamine B, rhodamine 6G, and other xanthene system dyes; and,

(7) pyridine 1 and other pyridine system dyes.

Chemical Structure 1

As solvent for ink used for color conversion layer formation in this invention, any arbitrary solvent which can be used to dissolve the above color conversion dyes can be used. For example, toluene and other benzene system nonpolar solvents, chloroform, alcohols, ketone system, and other polar solvents, can be used as solvents for inks. Solvents for ink can comprise a single component. Or, with the aim of adjusting the viscosity, vapor pressure, solubility, fluidity, and/or wettability, a plurality of solvents may be mixed to prepare an ink solvent.

Further, in order to make the refractive index of the color conversion layers 20 the same as that of the color filter layers 30, inks for color conversion layer formation may be manufactured by adding a solvent to a thermosetting resin composition into which the above color conversion dyes have been dispersed.

In this embodiment, ink for color conversion layer formation can be manufactured by mixing at least one type of color conversion dye in a solvent. In order to eliminate the effects of water and oxygen, it is preferable that the ink be manufactured in an inert gas (for example, nitrogen, or a rare gas such as argon gas) atmosphere. In order to remove water and oxygen in the solvent prior to manufacturing the ink, well-known arbitrary means of the art, such as degasification treatment, treatment using a water absorbent, treatment using an oxygen absorbent, distillation, and similar, may be used in pretreatment of the solvent.

The manufactured ink is caused to adhere onto the lyophilic layer 50 positioned between the adjacent bank layers 60, using an arbitrary inkjet device and method known in the art, with the ability to apply the ink at the desired resolution as a condition. The inkjet device and method may employ a thermal inkjet method, or may employ a piezo inkjet method.

Drying of ink which has been caused to adhere using an inkjet method can be performed by heating at a temperature which causes evaporation of the solvent in the inert gas or in vacuum, or at a temperature at which the thermosetting resin composition hardens. At this time, it is desirable that the heating temperature be set such that degradation or thermal decomposition of the color conversion dyes in the ink do not occur.

A color conversion layer manufactured using ink of this invention has a film thickness of 2000 nm (2 μm) or less, preferably between 100 and 2000 nm, and still more preferably between 100 and 1000 nm. A color conversion layer manufactured using an ink comprising a color conversion dye dispersed in a resin composition has a film thickness which is preferably between 100 and 2000 nm.

(Barrier Layer Formation Process)

Finally, a barrier layer 70 is formed so as to cover the color filter layers 30, bank layers 60, and color conversion layers 20. The barrier layer 70 is effective in enabling the continuation of stable performance when the patterned color conversion layers 20 employ materials which degrade due to the interposition of water and/or oxygen.

As the barrier layer material, a material having barrier properties with respect to gases and organic solvents, and with high transparency in the visible region (transmissivity of 50% or higher in the range 400 to 700 nm), can be used. Materials which can be used in the barrier layer include, for example, SiOx, SiNx, SiNxOy, AlOx, TiOx, TaOx, ZnOx, and other inorganic oxides and inorganic nitrides.

The barrier layer can be formed by a sputtering method, CVD method, vacuum evaporation deposition method, or another method. From the standpoint of avoiding damage to the color conversion layers 20 during barrier layer formation, it is desirable that the barrier layer be formed using a CVD method which can be performed at low temperatures of 100° C. or below, and in which the energies of particles used in film deposition are low.

In the above explanations, an example was presented in which, referring to FIG. 1A to FIG. 1C, three types of color filter layers 30 were used. However, with the condition that a portion of the bank layers 60 used to form the color conversion layers 20 with high fineness have a plurality of protuberances 63 formed from gentle curved surfaces, clearly a method of manufacture of this invention can be applied to the manufacture of color conversion filters employing two types, or four or more types, of color filter layers.

EMBODIMENTS

Example 1

Below, a specific example is used to explain the invention and advantageous results; however, the examples does not limit the scope of application of the invention. The following procedure was used to manufacture the color conversion filter 1000 of FIG. 1A to FIG. 1C.

(Formation of Black Matrix 40)

Color Mosaic CK-7001 (available from Fujifilm Corp.) was applied onto a transparent substrate 10 (1737 glass manufactured by Corning, 200 mm×200 mm×0.7 mm thick). Next, a photolithography method was used to form a black matrix 40 having a plurality of rectangle-shape opening portions. The black matrix 40 had a film thickness of 1 μm. Each of the rectangle-shape opening portions (equivalent to a subpixel) was 300 μm in the vertical direction×100 μm in the horizontal direction. The interval between adjacent rectangle-shape opening portions was 30 μm in the vertical direction and 10 μm in the horizontal direction.

(Color Filter Layer Formation)

Color Mosaic CR-7001 (available from Fujifilm Corp.) was applied onto the transparent substrate 10 with the black matrix formed. Next, a photolithography method was used to form red color filter layers 30R, comprising a plurality of stripe-shape portions of width 106 μm extending in the vertical direction. The film thickness of the color filter layer was 1 μm.

Next, except for the fact that Color Mosaic CG-7001 and CB-7001 (both available from Fujifilm Corp.) were used, a procedure similar to that for the red color filter layers 30R was used to form a green color filter layers 30G and a blue color filter layers 30B. The film thickness of both hf the layers was 1 μm, and the color filter layers both had stripe patterns of width 106 μm.

(Lyophilic Layer Formation)

Next, a plasma CVD device was used in a plasma CVD method, employing as starting material gases monosilane ($SiH_4$), ammonia ($NH_3$), and nitrogen ($N_2$), to deposit silicon nitride (SiN) to a film thickness of 300 μm onto the substrate with the color filter layers 30 formed, to form the lyophilic layer 50.

(Bank Layer Formation)

An acrylic system resin V259PAP5 (manufactured by Nippon Steel Chemical Co., Ltd.) was applied by a spin coating method so as to obtain a film thickness of 3.5 μm from the surface of the color filter layers 30. Next, a photolithography method was used to form a first portions 61. A pattern of dots of diameter 7 μm was formed at intervals of 300 μm so as to be positioned one at each pixel, positioned on the black matrix of width 30 μm between the red color filter layer 30R and the blue color filter layer 30B, extending in the direction perpendicular to the color filter layers (30R and 30B).

Next, the acrylic system resin V259PAP5 (manufactured by Nippon Steel Chemical Co., Ltd.) was applied by a spin coating method so as to obtain a film thickness of 5 μm from the surface of the color filter layers 30 in places in which the first portions 61 were not formed. Then, a photolithography method was used to form the second portions 62. The second portions 62 had a pattern of stripes of width 10 μm positioned at the boundaries of each of the stripe patterns of different color filter layers 30. At this time the protuberances 63 did not have stair-like step portions with the flat portions 64, but protruded gently to a height of 6.5 μm from the surface of the color filter layers 30 and to a height of 1.5 μm from the surface of the flat portions 64. The protuberances 63 were formed such that there were no discontinuities in the derivative of the curved surfaces at any arbitrary points on the curved surfaces.

(Surface Treatment)

Next, while flowing $N_2$ gas at 200 SCCM, plasma treatment was performed for 120 seconds at a applied power of 0.5 kW. Next, within one hour after the above treatment, the color conversion layers 20 were formed.

(Formation of the Green Color Conversion Layer)

1000 parts by weight toluene and 50 parts by weight of a mixture of coumarin 6 as a first dye and DEQ as a second dye (molar ratio coumarin 6:DEQ=48:2) were mixed to prepare an ink. The prepared ink was dripped using a multi-nozzle in a nitrogen atmosphere using an inkjet device (Litrex 120L, manufactured by Litrex Corp.). Next, drying of the ink was performed, without breaking the nitrogen atmosphere, using a vacuum drying furnace at a temperature of 100° C. in a vacuum of $1.0\times10^{-3}$ Pa. The green color conversion layer 20G obtained had a film thickness of 500 nm.

(Formation of the Red Color Conversion Layer)

1000 parts by weight toluene and 50 parts by weight of a mixture of coumarin 6 as a first dye and DCM-2 as a second dye (molar ratio coumarin 6:DCM-2=48:2) were mixed to prepare an ink. The prepared ink was dripped using a multi-nozzle in a nitrogen atmosphere using an inkjet device (Litrex 120L, manufactured by Litrex Corp.). Next, drying of the ink was performed, without breaking the nitrogen atmosphere, using a vacuum drying furnace at a temperature of 100° C. in a vacuum of $1.0 \times 10^{-3}$ Pa. The red color conversion layer 20R obtained had a film thickness of 500 nm.

(Barrier Layer Formation)

Next, the layered member with the green color conversion layers 20G and red color conversion layers 20R formed as described above was transferred to a plasma CVD device without breaking the vacuum. The plasma CVD method was used to form a barrier layer 70 comprising silicon nitride (SiN) of film thickness 1 μm, to obtain a color conversion filter. The raw material gasses used were monosilane ($SiH_4$), ammonia ($NH_3$), and nitrogen ($N_2$). The temperature of the layered member during formation of the barrier layer 70 was maintained at 100° C. or lower.

Comparative Example 1

Similarly to the above Example 1, a black matrix 240 was formed on a transparent substrate 210. Next, the color filter layers 230 (R, B, G) and lyophilic layer 250 were formed.

Then, an acrylic system resin V259PAP5 (manufactured by Nippon Steel Chemical Co., Ltd.) was applied by a spin coating method so as to obtain a film thickness of 5 μm from the surface of the color filter layers 230. Next, a photolithography method was used to form bank layers 260. The bank layers 260 had the shape of stripes of width 10 μm, positioned at the boundaries of each of the stripe patterns of different types of color filter layers 230.

Next, the acrylic system resin V259PAP5 (manufactured by Nippon Steel Chemical Co., Ltd.) was applied so as to have a film thickness of 1.5 μm from the upper portion of the bank layers 260. Then, a photolithography method was used to form spacer portions 280 on the upper portion of the bank layers 260. The spacer portions 280 had a pattern of dots of diameter 7 μm formed at intervals of 330 μm so as to be positioned one at each pixel.

Further, surface treatment using plasma was performed similarly to that in Example 1. Then, green color conversion layers 220G and red color conversion layers 220R, as well as a barrier layer 270, were formed, to manufacture a color conversion filter 2000.

<Evaluation 1>

The color conversion filters (1000 and 2000) formed in Example 1 and Comparative Example 1 were set in a lamination device, with the barrier layer (70 or 270) of the color conversion filter facing upward. A dispenser was used to continuously apply an epoxy system ultraviolet-hardening adhesive (UVRESIN XNR5516, manufactured by Nagase ChemteX Corp.) onto the outer peripheral portion of the substrate, and then a thermosetting epoxy adhesive of viscosity 300 mPa·s was dripped onto the center area of the screen.

Next, in place of an organic EL substrate, 1737 glass (manufactured by Corning, 200 mm×200 mm×0.7 mm thick) was placed against the color conversion filter (1000 or 2000) in the process described below, and a laminated substrate was manufactured: (1) first, the interior of the lamination device was evacuated to a pressure of approximately 10 Pa; (2) with the surface of the 1737 glass in a state of opposition to the barrier layer (70 or 270) of the color conversion filter, the two substrates were brought to approximately 20 μm, and pixel positions were determined; (3) while returning the pressure within the device to atmospheric pressure, a load of approximately 0.1 kg/cm² was applied.

Next, only the portions to which the epoxy system ultraviolet-hardening adhesive had been applied were irradiated with ultraviolet rays from the side of the color filter substrate and hardened. Then, this was placed into a heating furnace and heated at 95° C. for 1 hour. Next, natural cooling was performed for 30 minutes in the furnace, to obtain the laminated substrate. The spreading of filling resin in the substrate was evaluated based on the number of included air bubbles confirmed within the laminated substrates thus manufactured.

Twelve panels each of the color conversion filters (1000 and 2000) manufactured according to Example 1 and Comparative Example 1 were sealed in the above manner, and inclusion of air bubbles was observed. As a result, inclusion of air bubbles was observed in one panel in each case. Hence there was no difference in the spreading of the filling resin between Example 1 and Comparative Example 1, and it was confirmed that the protuberances 63 in the color conversion filter 1000 of Example 1 functioned adequately as spacers.

<Evaluation 2>

Fluorescence intensities obtained when the color conversion filters (1000 and 2000) were optically excited were compared for Example 1 and Comparative Example 1.

An excitation light source (peak wavelength 470 nm) of constant intensity was used to irradiate color conversion filters (1000 and 2000) manufactured according to Example 1 and Comparative Example 1, and a spectral radiation luminance meter, CS100 (manufactured by Konica Minolta) was used to measure the fluorescence intensity. Next, twelve panels of each color conversion filter (1000 and 2000) were held for 1000 hours in a high-temperature, high-humidity chamber at a temperature of 80° C. and humidity of 90%. Then, fluorescence intensity measurements similar to those above were performed, and the storage life was evaluated.

TABLE 1

|  | Initial fluorescence intensity* |
| --- | --- |
| Example 1 | 1 |
| Comparative Example 1 | 1.05 |

*The average initial fluorescence intensity for the twelve panels of the color conversion filters of Example 1 was taken to be 1.

TABLE 2

| | Fluorescence intensity after high-temperature, high-humidity storage treatment* ** | | | |
| --- | --- | --- | --- | --- |
| | 0.5 or less | 0.5 to 0.7 | 0.7 to 0.9 | 0.9 or above |
| Example 1 | — | — | — | 12 |
| Comparative Example 1 | 2 | 6 | 4 | — |

*The average initial fluorescence intensity for the twelve panels of the color conversion filters of Example 1 was taken to be 1.
**The number of panels among the twelve panels of color conversion filters with each fluorescence intensity, measured after storage treatment, are shown.

As shown in Table 2, for the color conversion filters (1000) manufactured according to Example 1, adequate fluorescence intensity could be maintained for all twelve panels, even after high-temperature, high-humidity storage treatment. On the other hand, among the color conversion filters (2000) of Comparative Example 1, in which spacer portions 280 were formed on the upper portion of the bank layer 260, among the twelve panels subjected to storage treatment, the fluorescence intensity fell to from 0.5 to 0.7 of the initial fluorescence intensity for six panels, and fell to 0.5 or lower for two panels with color conversion filters. That is, in Comparative Example 1, the rate of occurrence of panels with a marked drop in fluorescence intensity was high compared with Example 1. Further, in Comparative Example 1 there was not even one panel with a color conversion filter in which the fluorescence intensity could be maintained at 90% of the initial fluorescence intensity or higher.

It is thought that in Example 1, in which spacer portions 280 were formed on the upper portion of the bank layers 260, because there are portions with acute angles in the shape of the joining portions of the spacer portions 280 and the bank layers 260, the barrier layers 270 did not adequately cover portions of the joining portions, so that gaps were formed in the barrier layers 270 near portions of the joining portions with acute angles. That is, because of these gaps, water passed through the interface between the barrier layer and spacer portions and the bank layer, or moisture absorption by the spacer portions and bank layer themselves occurred, and so it is inferred that the color conversion layers 220 were degraded, and the life of the color conversion filter 2000 was markedly shortened.

On the other hand, in Example 1 it is thought that the protuberances 63 had no stair-like step portions, but were formed from gentle curved surfaces, so that the barrier layers 70 were formed without gaps, and adequate coverage could be obtained.

As described above, in a example of this invention, manufacturing color conversion filters by an inkjet method, it was possible to measure color conversion filters with a more stable storage life while having resin filling performance equivalent to that of the comparative example.

As described above, by providing a portion of the bank layer with a plurality of protuberances 63 formed from gentle curved surfaces in order to form color conversion layers with high fineness, a color conversion filter 1000 having the following advantages could be provided: (1) leakage of ink into regions outside subpixels (in particular, into adjacent subpixels) could be prevented, and the desired color conversion layers 20 could be formed in the prescribed subpixels; and, (2) the gap between substrates could be controlled precisely when laminating the color conversion filter 1000 to an organic EL substrate, and moreover the filling resin could be used to uniformly fill the gap.

Further, because the protuberances 63 protrude with gentle curved surfaces and do not have stair-like step portions, when forming a barrier layers 70 covering the color filter layers 30, color conversion layers 20, and bank layers 60, there are no acute angles in the shape of the joining portions between the barrier layers 70 and the bank layers 60. Hence the occurrence of gaps in the barrier layers 70 near the joining portions can be prevented. By this means degradation of the element by the outside environment can be prevented, and a color conversion filter with stabilized storage life can be manufactured. By using this invention, color conversion filters with high reliability are obtained with good production yields, and consequently it is possible to reduce the cost of high-fineness flat panel displays using color conversion filters.

The invention claimed is:

1. A color filter, comprising:
a light-permeable substrate;
a plurality of color filter elements contacting directly with each other;
a plurality of discrete bank elements that are spaced apart from one another, the bank elements being disposed above and vertically aligned with contact portions of the color filter elements;
a barrier layer that covers the color filter elements and the bank elements,
wherein a first set of the bank elements are shaped as protuberances having gentle curved surfaces with convex upper sides that protrude in a direction away from the substrate, and a second set of the bank elements are shaped as protuberances lacking gentle curved surfaces.

2. The color filter according to claim 1, wherein the bank elements in the first set include first portions and second portions covering the first portions, and the bank elements in the second set include second portions but not first portions.

3. The color filter according to claim 2, wherein the second portions of the bank elements in the first set are formed using a photosetting resin or a photosetting/thermosetting resin.

4. The color filter according to claim 2, wherein the first portions and second portions of the bank elements in the first set are formed from the same material.

5. The color filter according to claim 1, wherein the barrier layer is made of a material selected from the group consisting of SiOx, SiNx, SiNxOy, AlOx, TiOx, TaOx, and ZnOx.

* * * * *